US006885209B2

United States Patent
Mak et al.

(10) Patent No.: US 6,885,209 B2
(45) Date of Patent: Apr. 26, 2005

(54) DEVICE TESTING

(75) Inventors: Tak M. Mak, Union City, CA (US); Michael J. Tripp, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 75 days.

(21) Appl. No.: 10/224,492

(22) Filed: Aug. 21, 2002

(65) Prior Publication Data

US 2004/0036494 A1 Feb. 26, 2004

(51) Int. Cl.⁷ .................. G01R 31/02; H04B 17/00; H04B 3/46; H04Q 1/20
(52) U.S. Cl. .................. 324/763; 375/219; 375/226; 375/376
(58) Field of Search ................... 324/763; 375/376, 375/226, 219

(56) References Cited

U.S. PATENT DOCUMENTS 4,809,306 A * 2/1989 Somer .................. 375/376
6,331,999 B1 * 12/2001 Ducaroir et al. .......... 375/226

\* cited by examiner

*Primary Examiner*—Anjan Deb
*Assistant Examiner*—John Teresinski
(74) *Attorney, Agent, or Firm*—Kenyon & Kenyon

(57) ABSTRACT

A testing mode is provided for self testing of the transmitter and receiver pair provided on-chip. The testing mode targets each module individually; wherein when one of the two devices is placed under test, the other is used as a tester. When the transmitter is the device under test and the receiver is the tester that receives a transmitted signal from the transmitter, the receiver is used to determine the data eye size with the transmitted signal. When the receiver is the device under test and the transmitter is the tester, the transmitter is used to determine the amount of noise and power loss tolerated by the receiver.

19 Claims, 13 Drawing Sheets

DEVICE TESTING

FIELD OF THE INVENTION

The present invention relates to on-chip stress testing for serial links to determine the stress tolerance of the serial links. In particular, the present invention relates to using simple digital controls and on-chip components to find the size of a data eye with a transmitted signal, and to stress test the receiver by stressing the transmitted signal.

BACKGROUND

FIGS. 1 and 2 show an exemplary embodiment of an on-chip system. FIG. 2 shows the on-chip system 100 of FIG. 1 in detail. As shown in FIG. 1, the on-chip system 100 includes a transmitter 140 and receiver 180 pair. As shown in FIG. 1, the transmitter 140 receives the data to be transmitted and transmits a high speed serial outgoing data stream. The receiver 180 receives a high speed serial incoming data stream and provides the data to the entire circuit. The high speed serial outgoing data stream and incoming data stream form a high speed serial link.

To enable the receiving end of serial links to receive data reliably, a clock may be embedded into the serial incoming data stream. The receiver 180 recovers the embedded clock from the serial incoming data stream, and uses the recovered clock to strobe the data. Accordingly, clock synchronization associated with parallel data may be improved. During this serialization process, data is usually encoded so that there will be enough signal edges to recover the clock.

As shown in FIG. 2, the transmitter 140 includes a parallel to serial encoder 141, a differential driver 143 and a clock multiplier 145. In the on-chip system of FIG. 2, a system clock is input to the clock multiplier 145, which outputs a bit rate clock to the parallel to serial encoder 141. Parallel data is received at the parallel to serial encoder 141, where data is encoded so that there will be enough signal edges for a receiver to recover this clock. Serial data from the parallel to serial encoder 141 is sent to the differential driver 143 where a differential signal is transmitted therefrom as a serial outgoing data stream.

As shown in FIG. 2, the receiver 180 includes differential sense amplifiers 181 and 187, a buffer 183, a serial to parallel decoder 185, and a phase locked loop 1800. The receiver 180 recovers the clock embedded in the serial incoming data stream input to the receiver 180, and this recovered clock is thus centered in the data eye of the input incoming data stream. That is, using the recovered clock as a strobe, this strobe will latch the data in the incoming data stream and send the data to a serial-to-parallel decoder 185 for use.

As shown in FIG. 2, incoming data streams I and I# with the embedded clock are received by the receiver 180 at the two differential sense amplifiers 181 and 187. One of the differential sense amplifiers 181, along with buffer 183, comprises a data recovery circuit, where data is recovered. As shown in FIG. 2, the differential sense amplifier 181 receives the received data stream with embedded clock I and I#, and outputs differential signals O and O#. Buffer 183 then resolves the differential signals O and O#, or a variation of one of the signals O and O#, as single-ended recovered data to the serial to parallel decoder 185, where the single-ended data is decoded back to parallel data.

As shown in FIG. 2, the other differential sense amplifier 187 receives the incoming data stream with embedded clock I and I#, and converts the data stream to a single-ended wide-swing signal to be sent to the phase locked loop 1800. The differential sense amplifier 187, along with the phase locked loop 1800, comprises a clock recovery circuit, where the phase locked loop 1800 includes a voltage controlled oscillator (VCO) 1802, a divider 1804, a phase detector 1806 and a loop filter 1808. The output of the phase locked loop 1800 is the recovered clock used to strobe the data recovered at the differential sense amplifier 181 of the data recovery circuit.

It should be appreciated that the on chip system 100 shown in FIG. 2 is merely an example of a serial signaling transmit/receive on chip system. That is, there are many exemplary circuit techniques that deliver data from one end of a transmitter to the other end of a receiver, including but not limited to: the use of many bit pairs in lieu of parallel to serial encoding; other forms of encoding beyond 8B/10B encoding, or no encoding at all; the use of recovered clock rather than embedded clock; the use of digital circuit techniques for data/clock recovery other than the use of phase locked loop (PLL); the use of pre-emphasis circuitry to compensate for high frequency loss in transmission media; and the like.

FIG. 3 shows an exemplary diagram of an overlay of the cycles of a data stream. As high speed signals are sent along long circuit traces on a board, backplane or cables, the high speed signals tend to be affected by the properties of the transmission medium and neighboring electrical activities. This will show up as jittering noises and power loss. As shown in FIG. 3, jittering signal edges and varying voltage levels of the data stream form a data eye 200. As the signal is generated over a number of cycles, the signal may vary, and thus, may not be very consistent. That is, at the receiver end, as shown in FIG. 3, the signal may be changed in the time domain and the voltage level domain, forming the data eye.

BRIEF DESCRIPTION OF THE DRAWINGS

The present invention is illustrated by way of example and not limitation in the figures of the accompanying drawings in which like references indicate similar elements and in which.

DETAILED DESCRIPTION

It should be appreciated that many examples of a serial signaling transmit receive on system exist. Although the exemplary embodiments of the present invention will be described using the exemplary on chip system of the following figures, the basic techniques of the exemplary embodiments of the present invention are amenable to all types of serial signaling transmission systems.

Figure 1:
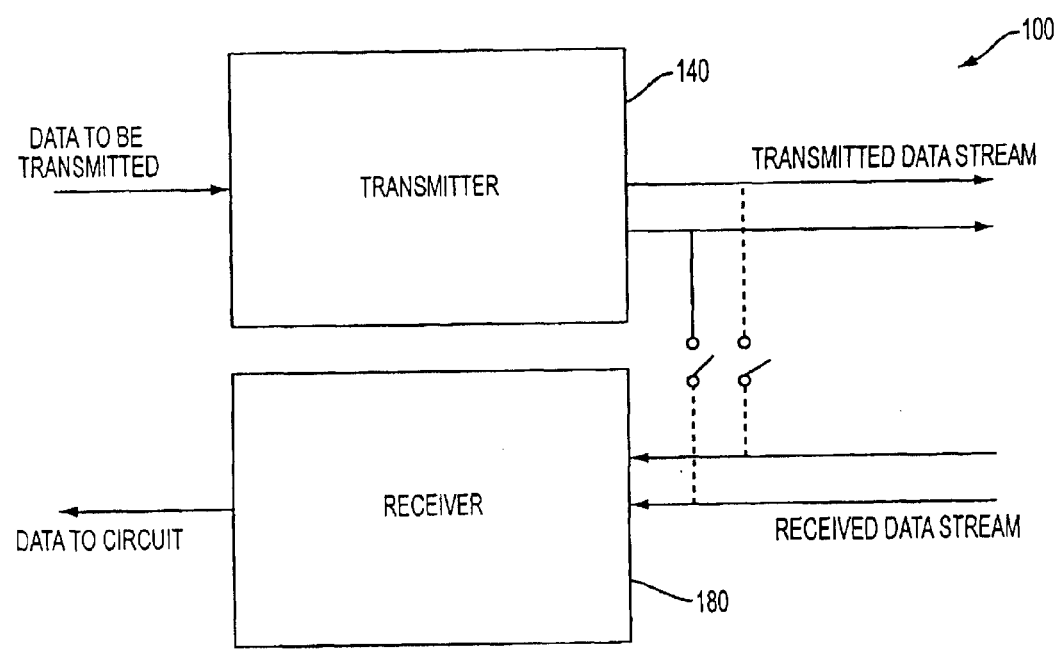
FIG. 1 shows one exemplary embodiment of an on-chip system.
Figure 4:
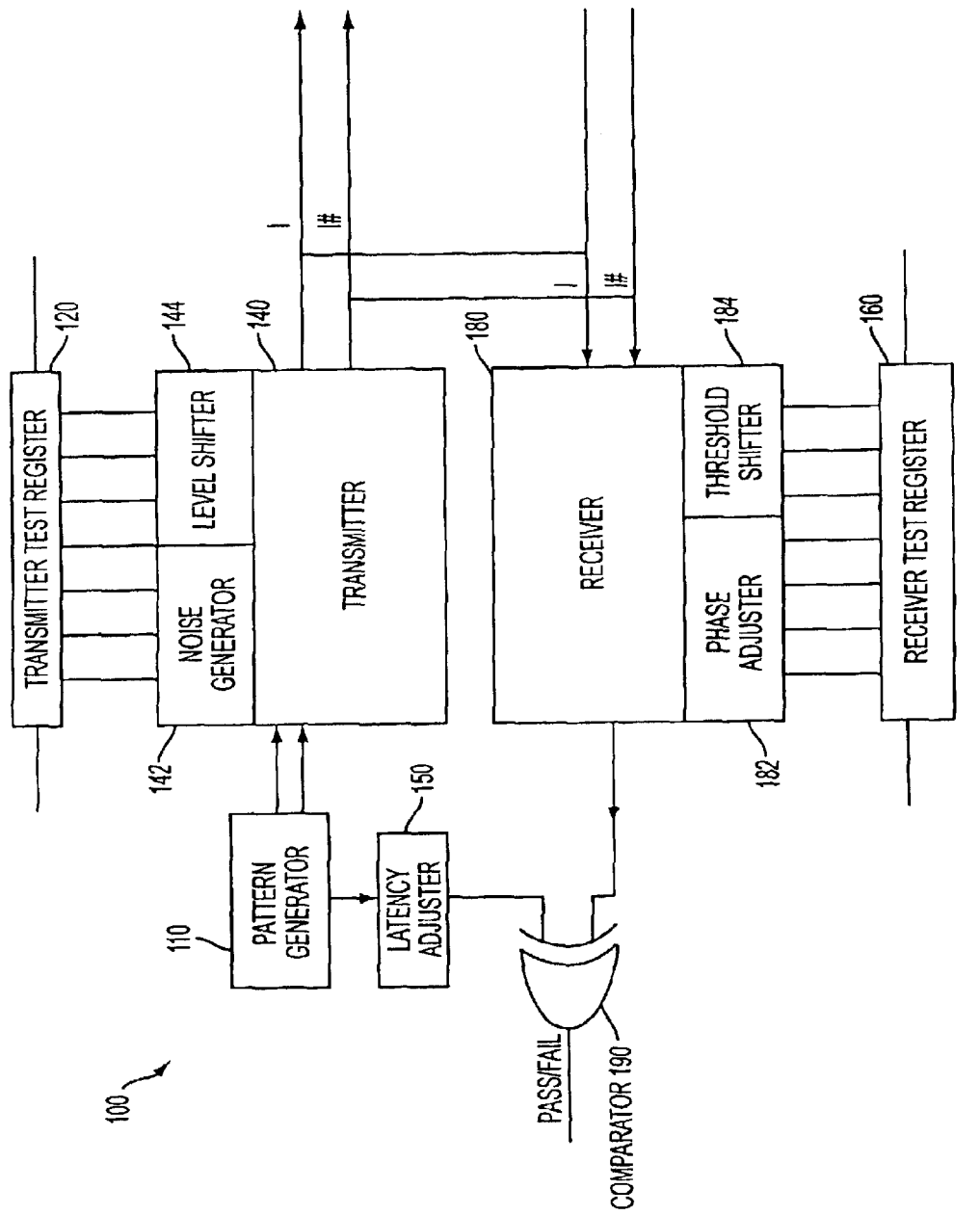
FIG. 4 shows one exemplary embodiment of an on-chip system in a testing mode in accordance with an exemplary embodiment of the present invention.

FIG. 4 shows an exemplary embodiment of an on-chip system in a testing mode for testing serial links using on-chip components, according to this invention. The construction of the on-chip system 100 of FIG. 4 is basically the same as that of the on-chip system of FIG. 1. That is, the on-chip components of the on-chip system of FIG. 1, which is in a non-testing mode, are basically the same as those in the on-chip system of FIG. 4 in a testing mode. It should be appreciated that the on-chip components of FIG. 4 that are identical or equivalent to those of FIG. 1 are designated by the same reference numerals, and a detailed description of such elements are thus omitted.

As shown in FIG. 4, in accordance with the various exemplary embodiments of this invention, in a testing mode, a transmitter test register 120 is provided, and the transmitter 140 and the transmitter test register 120 are connected to a noise generator 142 and a level shifter 144. Further, a receiver test register 160 is provided, and the receiver 180 and the receiver test register 160 are connected to a phase adjuster 182 and a threshold shifter 184.

Additionally, in accordance with the exemplary embodiments of this invention, in a testing mode, as shown in FIG. 4, the transmitter 140 and the receiver 180 are connected. That is, unlike the non-testing mode as shown in the exemplary embodiment in FIG. 1, the transmitter 140 is connected to the receiver 180 to provide loopback of the transmitted signal to the on-chip system 100. Thus, the outgoing serial data streams I and I# from the transmitter 140 is provided as the loopback signal, or the incoming serial data stream, to the receiver 180. It should be appreciated that the transmitter 140 and the receiver 180 may be connected on-chip or off-chip during testing in the exemplary embodiments of this invention.

Furthermore, as shown in FIG. 4, in the testing mode, a generated pattern from a pattern generator 110 is provided as input to the transmitter for testing. The pattern generator 110 may provide worst case patterns for the serial link, and therefore, the testing of the serial link does not require using the other components on the chip, i.e., the core.

In accordance with the various exemplary embodiments of this invention, the transmitter 140 and the receiver 180 are tested at the interfaces individually. In particular, when one of the two devices is a device under test, the other is used as a tester. For example, to test the transmitter 140, the receiver 180 is used as the tester. Similarly, to test the receiver 180, the transmitter 140 is used as the tester. That is, in accordance with the various exemplary embodiments of this invention, two different types of testing are performed for the transmitter 140 and the receiver 180.

Figure 5:
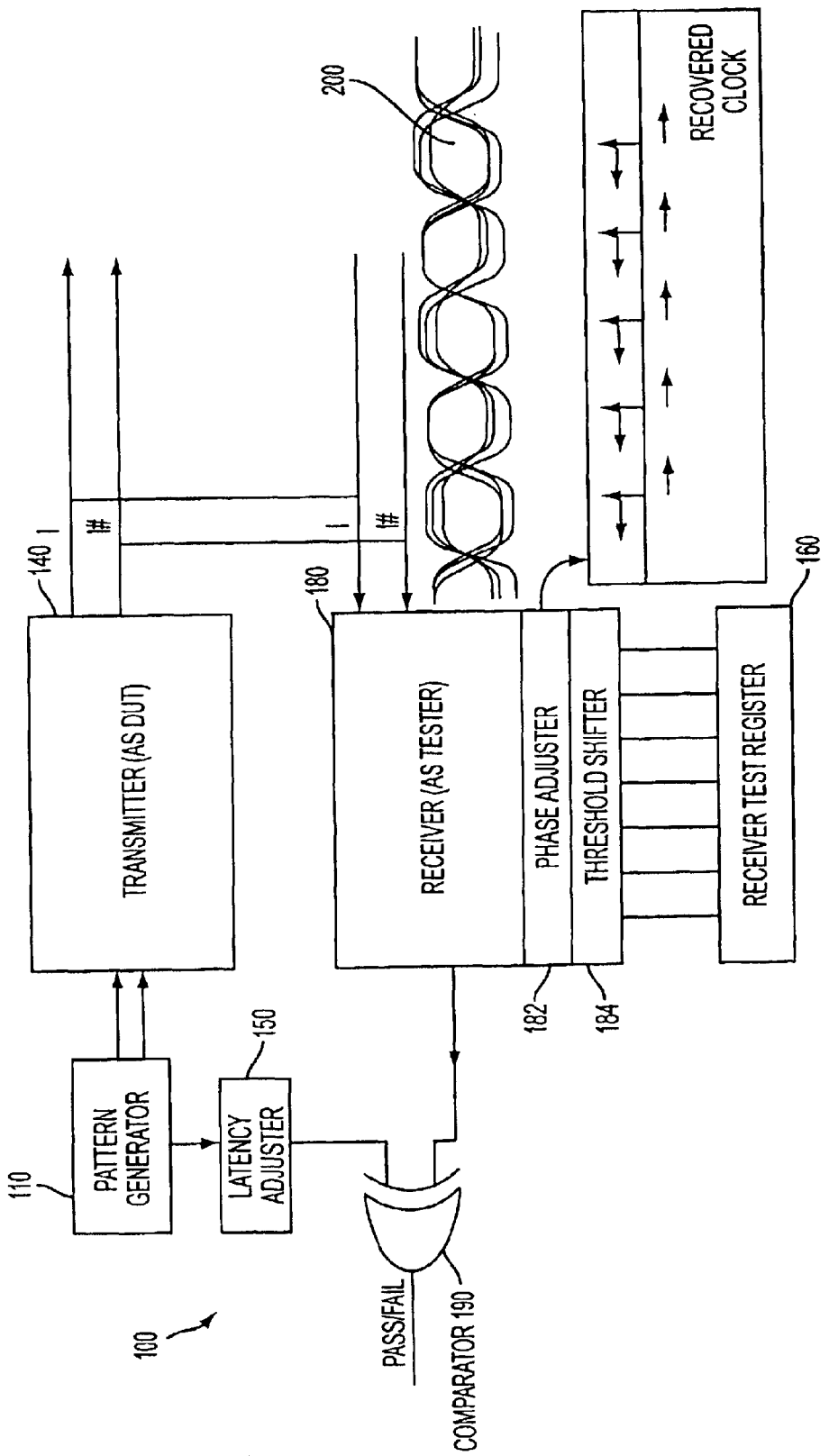
FIG. 5 shows an exemplary embodiment of the on-chip system of FIG. 4 in a transmitter testing mode.

FIG. 5 shows an exemplary embodiment of the on-chip system 100 of FIG. 4 in a transmitter testing mode in accordance with the various exemplary embodiments of this invention. As shown in FIG. 5, the transmitter 140 is the device under test (DUT), and the receiver 180 is the tester. As discussed above, the transmitter 140 and the receiver 180 are connected. That is, the output of the transmitter 140 is connected to the input of the receiver 180 to provide loopback of the transmitted signal to the on-chip system 100. Accordingly, the receiver 180 receives the loopback signal I and I# from the transmitter 140. In accordance with various exemplary embodiments, the receiver 180 includes a differential sense amplifier that takes the differential voltage from the complementary input signals received from the transmitter 140.

The transmitter 140 is tested by adjusting the threshold of the receiver 180 and the phase of the recovered clock from the loopback signal I and I# received by the receiver 180 from the transmitter 140, and then using the recovered clock to strobe the data along the time domain and voltage level domain to determine the size of the data eye of the loopback signal I and I#. Because the inverse of noise is the width of the data eye and the inverse of power loss is the height of the data eye, by determining the width and height of the data eye, noise and power loss tolerated by the on-chip system 100 may be determined. That is, as the phase of the recovered clock is adjusted and the threshold of receiver 180 is shifted, the data may be strobed to indicate the size of the data eye in the time and voltage domains. That is, the width of the data eye along the time domain and the height of the data eye along the voltage level domain may be determined.

In accordance with this exemplary embodiment, to strobe the data, the clock embedded into the loopback signal I and I# is recovered at the receiver 180. The receiver 180 uses the recovered clock to strobe the incoming data stream to determine the data eye size. In particular, in the exemplary embodiments of this invention, the data values held in the receiver test register 160 at each clock strobe, as the phase value of the clock is adjusted by the phase adjuster 182 and the threshold of the receiver is shifted by the threshold shifter 184, define the phase of the recovered clock and the threshold setting of the receiver differential sense amplifier in the receiver 180. The values at the two ends of the data eye are determined from the held values, whereby the data eye width is obtained from the two end values. Similarly, the values at the top and bottom of the data eye are determined to obtain the data eye height. That is, in strobing the data, the end points of the data eyes are the values where erroneous data may be strobed along the time domain, and the values above and below the data eye are values where erroneous data may be strobed along the voltage level domain, and by determining these values, the width and height of the data eye may be determined.

In the exemplary embodiment shown in FIG. 5, the pattern generator 110 generates a test pattern as a serial signal data stream to be transmitted and provides the serial signal data stream to the transmitter 140 to test the serial link for worst case condition. That is, a generated test pattern is provided to the transmitter 140 for testing, instead of normal data to be transmitted, as shown in the non-testing mode of FIG. 1. It should be appreciated that the pattern generator 110 may be a pseudo-random pattern generator or any other pattern generator that generates predetermined sequences of patterns that stress specific aspect of the noise coupling so that the serial link can be tested for the worst case conditions. In various exemplary embodiments, the pattern generator 110 generates patterns of 1's and 0's.

As the on-chip system 100 is stressed for the worst case condition, data from the serial signal data stream may not be recoverable, and thus, a mismatch between the data stream to the transmitter 140, i.e. the generated pattern from the pattern generator 110, and the loopback received signal from the receiver 180 may occur. As shown in FIG. 5, a pass/fail comparator 190 compares the loopback received signal from the receiver 180 against the data stream to the transmitter 140 for any mismatch.

Due to the delay through the transmitter 140, the loopback connections and the receiver 180, there is a need to adjust for the latency so that the data stream to the transmitter 140 will match with the loopback received signal from the receiver 180. Accordingly, as shown in FIG. 5, a latency adjuster 150 is provided to delay the data stream to the transmitter 140 to match with the loopback received signal from the receiver 180. That is, since the data stream from the pattern generator 110 may take a long path through the transmitter 140, the loopback connections to the receiver 180, and the receiver 180, the data stream from the pattern generator 110 may have the latency adjusted by the latency adjuster 150 so that the data stream can be compared by the pass/fail comparator 190 with the received signal. The pass/fail comparator 190 compares for a match between the loopback received signal from the receiver 140 and the data stream from the pattern generator 110 that has been adjusted for latency.

According to the exemplary embodiments of this invention, the phase of the recovered clock from the receiver 180 is adjusted to detect the size of the data eye in the time domain. By strobing the data while changing the phase of the recovered clock in the forward and backward direction in time relative to the data, the size of the eye in the time domain may be found.

As shown in FIG. 5, a phase adjuster 182 is provided to adjust the phase of the recovered clock, and the transmitted data is strobed by moving the recovered clock along the time domain to determine the width of the data eye as the phase is adjusted. That is, the receiver test register 160 programs and maintains the phase values as the recovered clock is moved along the time domain to determine the width of the data eye.

Figure 2:
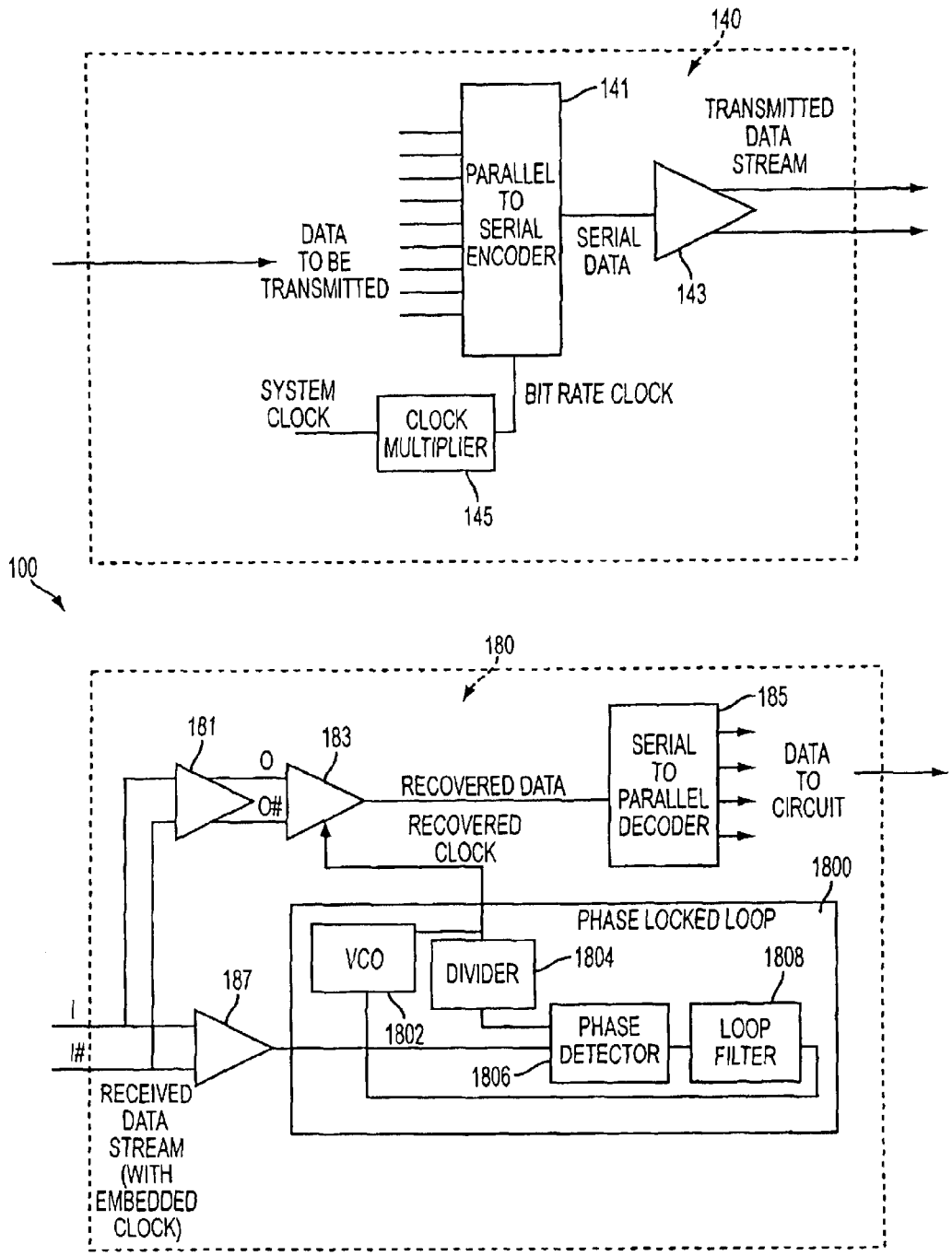
FIG. 2 shows the exemplary embodiment of the on-chip system of FIG. 1 in further detail.

Contrary to a normal data receiving mode in FIGS. 1 and 2, where the data is strobed reliably such that the edge of the recovered clock is centered in the middle of the data eye, in the testing mode, the receiver test register 160 adjusts the clock edge of the recovered clock along the time domain. That is, in the testing mode, the recovered clock is moved back and forth in the time domain and the phase values are maintained as the clock is moved, so that the width of the data eye along the time domain may be determined.

Likewise, to determine the voltage swing of the data eye, the threshold of the receiver 180 is adjusted. As shown in FIG. 5, a threshold shifter 184 is provided to shift the threshold of the differential sense amplifier in the receiver 180 to determine the size of the voltage swing, and thus determine the height of the data eye in the voltage level domain. In particular, the threshold of the differential sense amplifier is shifted to determine room in the voltage level, and the receiver test register 160 programs and controls the threshold values as the sensing threshold is moved along the level domain to determine the height of the data eye.

To determine the size of the data eye, the phase and threshold values as programmed by the receiver test register 160 to reflect the adjustments by the phase adjuster 182 and the threshold shifter 184 are combined. By combining the two adjustments, the size of the transmitted data eye in both the time domain and the voltage level domain can be determined. In particular, the phase value and threshold value programmed by the receiver test register 160 at each strobe as the phase value and the threshold value are adjusted and examined by the receiver test register 160. By determining the values from endpoint to endpoint and top to bottom, the width and height of the data eye may be determined, and are used to determine the size of the data eye.

Figure 3:
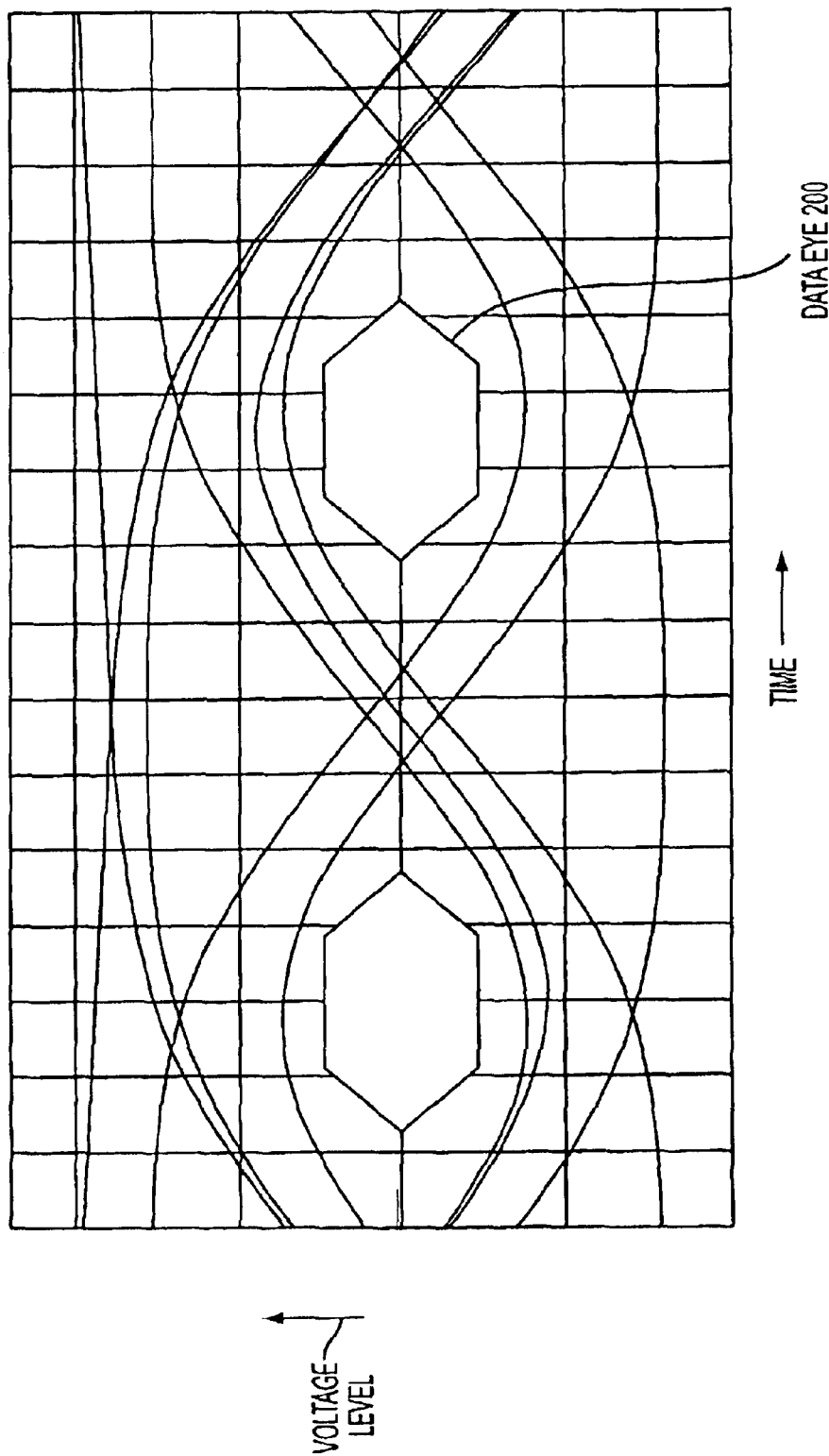
FIG. 3 shows an exemplary embodiment of an overlay of the cycles of a data stream.

As shown in FIG. 5, in the testing mode for the on-chip system 100, the pass/fail comparator 190 compares the loopback received signal from the receiver 180 against the generated pattern to the transmitter 140 that has been latency adjusted by the latency adjuster 150 for any mismatch. However, as shown in FIG. 3, at the endpoints of the data eyes along the time domain, erroneous data may be latched. Similarly, erroneous data may be latched above and below the data eye. When erroneous data is detected by the pass/fail comparator 190, a fail signal is first indicated by the pass/fail comparator 190. Accordingly, when a fail signal is indicated by the pass/fail comparator 190, the phase value programmed by the receiver test register 160 along the time domain indicates the end points of the data eye. Similarly, the threshold value programmed by the receiver test register 160 when a fail signal is first indicated by the pass/fail comparator 190 indicates the top and bottom of the data eye. In the exemplary embodiments of this invention, by determining the values maintained by the receiver test register 160 at the end points and the top and bottom of the data eye, the width and height of the data eye may be determined.

Alternately, in another exemplary embodiment, a quick test can be done by loading pre-determined values into the receiver and transmitter test registers 120 and 160, and the patterns from the pattern generator 110 can be run through the on-chip system 100. The pre-determined values correlate to how a normal transmitter in a non-testing mode should behave. That is, the predetermined values are chosen such that the receiver may reliably receive correct data even if the threshold of the receiver 180 is moved and edges of recovered clock is shifted. If the receiver 180 produces data which mismatches the transmitted data from the pattern generator 110, as indicated by the pass/fail comparator 190, then the transmitter 140 may have faults that should be rejected.

Figure 6:
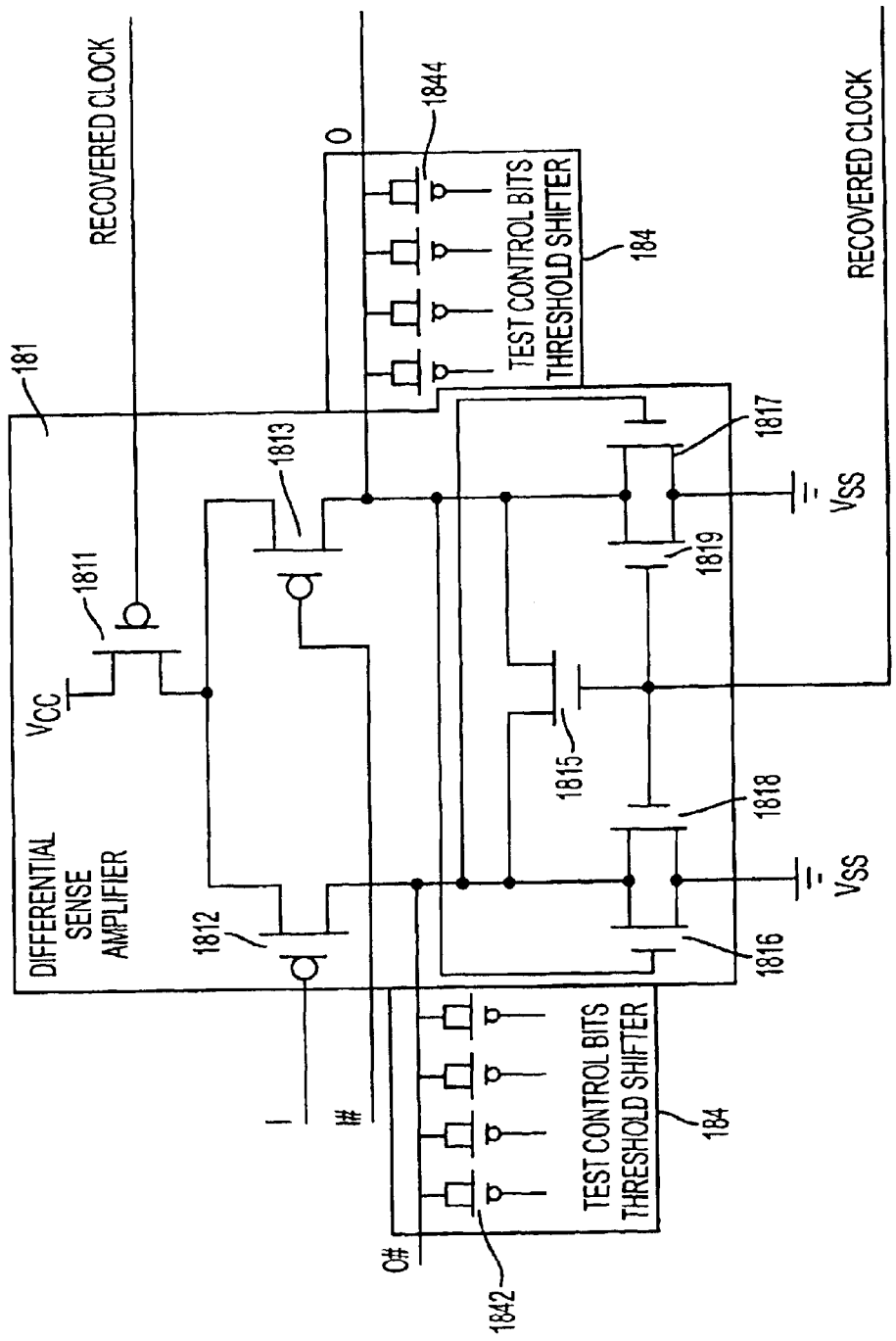
FIG. 6 shows an exemplary embodiment of an offset voltage adjuster of FIG. 5.

FIG. 6 shows one exemplary embodiment of the differential sense amplifier of the receiver 180, and a threshold shifter, in accordance with this invention. In this exemplary embodiment, the threshold shifter 184 adjusts the threshold of the receiver 180 by introducing offset to the differential sense amplifier 181 of the receiver 180. As shown in FIG. 6, the threshold shifter 184 includes a plurality of PMOS transistors 1842 and 1844 to add gate enabled capacitance to the differential sense amplifier 181. Once activated in the test mode, the plurality of PMOS transistors 1842 and 1844 may bring about an offset in the differential sense amplifier 181. In particular, by selectively turning on or off different combinations of the plurality of PMOS transistors 1842 and 1844, the loading capacitance of the differential sense amplifier 181 is varied.

In the exemplary embodiment of FIG. 6, the differential sense amplifier 181 is a clocked amplifier. As shown in FIG. 6, the differential sense amplifier 181 comprises a plurality of NMOS transistors 1811–1813 and a plurality of PMOS transistors 1815–1819.

In a non-testing mode, the differential sense amplifier 181 is a self-resetting sense amplifier. When the recovered clock is enabled, or high, the output O and O# of the differential sense amplifier 181 is pulled to ground Vss by the resetting NMOS transistors 1815, 1818, 1819, and the connection to Vcc through the PMOS transistors 1811 is off so that the differential sense amplifier 181 is without power. In this phase, all inputs I and I# are ignored. When the recovered clock changes from high to low, the NMOS transistors 1815, 1818, 1819 are turned off and the top PMOS transistor 1811 and the two inner PMOS transistors 1812 and 1813 start to conduct. Current will flow through the two PMOS transistors 1812 and 1813 on the left side and the right side to charge up the load output O and O#. The path with the faster charge up rate of the two paths through PMOS transistors 1812 and 1813 sends a feedback signal to the slower of the two paths to shut it off. Since PMOS transistors 1812 and 1813 is controlled by the inputs I and I#, a small differential voltage at the inputs I and I# result in the output O and O# swing from Vcc to Vss, thus a more distinct and wider differential voltage swing is created as output from the differential sense amplifier 181, and the small differential signal input I and I# to the differential sense amplifier 181 is therefore amplified as output O or O#.

In the testing mode, in accordance with various exemplary embodiments of this invention, gate enabled capacitance is added to vary the charge rate of, i.e. de-biasing, the differential amplifier 181 to introduce the offset to the differential amplifier 181. By controlling the PMOS transistors 1842 and 1844 of the threshold shifter 184, the charge rate may be varied to control the output O or O# from the differential sense amplifier 181. That is, as shown in FIG. 6, the PMOS transistors 1842 and 1844 of the threshold shifter 184 are provided on the two sides of the differential sense amplifier 180 to control the output O or O# provided on the two sides. The output O or O# depends upon which of the two sides charges faster, wherein the output O swings to Vcc, and the output O# swings to ground Vss, if the PMOS transistors 1842 on the O side charge faster, and the output O# swings to Vcc, and the output O swings to ground Vss, if the PMOS transistors 1844 on the O# side charge faster.

In this exemplary embodiment, the threshold shifter 184 introduces a positive or negative offset. If the differential voltage is below the set threshold, in one pass, the differential sense amplifier 180 may sense the wrong data and flag the pass/fail comparator 190 as a fail signal of the comparison between the data stream to the transmitter 140 and the received data from the receiver 180. Alternatively, this de-biasing can be applied in an opposite direction in another pass where the differential voltage is above the set threshold, to obtain a wider differential and allow reliable reading. The de-biasing results of the two passes are then combined to obtain both positive and negative offsets.

In this exemplary embodiment, the charging rate of the PMOS transistors 1812 and 1813 is modulated by the gate voltage of the differential inputs, and the gate enabled capacitance at O and O# provided by the transistors 1842 and 1844, so that one of the two outside PMOS transistors 1812 and 1813 will charge up the output O or O# faster than the other. In particular, the side with the added capacitance charges up slower. Unless the voltage of the input I or I# is sufficiently high, (thus turning on the PMOS transistors 1812 and 1813 stronger, the side of the two PMOS transistors 1812 and 1813 with the higher capacitance will also be slower and will be shut off from the other side. Thus, a de-biased differential sense amplifier will need a significantly high differential voltage to cause the differential sense amplifier to recognize the correct data.

It should be appreciated that many other possibilities of shifting the threshold of a differential sense amplifier exist, and that the differential sense amplifier 181 above is not limited to the above exemplary embodiment.

Furthermore, it should be appreciated that, though the exemplary embodiment of FIG. 6 is discussed with PMOS transistors as the transistors 1842 and 1844, the exemplary embodiments of this invention are not limited to the use of PMOS transistors. That is, it should be appreciated that the transistors 1842 and 1844 of FIG. 6 may also be NMOS transistors which may be selectively turned on or off to cause a change in offset in the differential sense amplifier 181.

Figure 7:
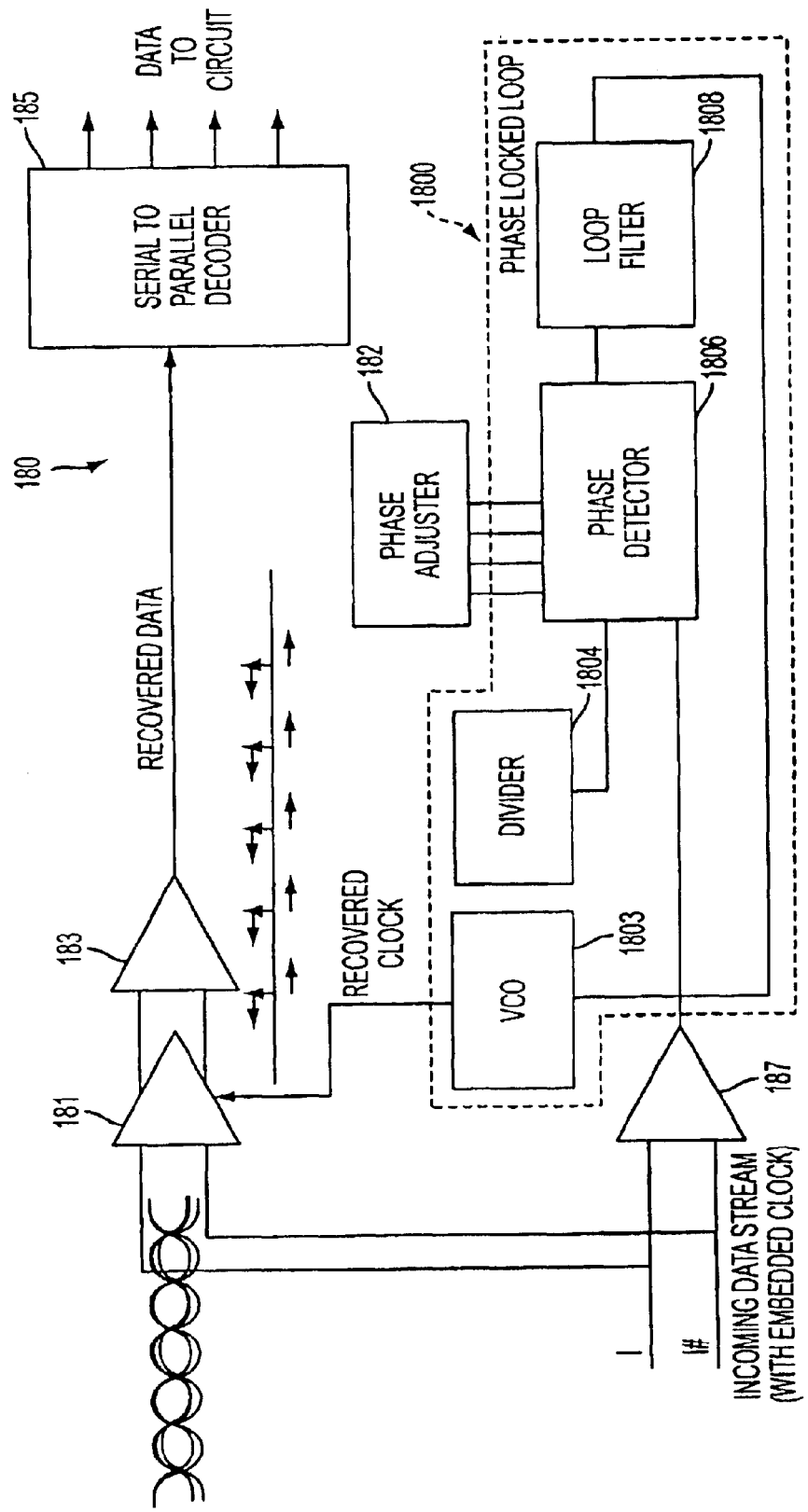
FIG. 7 shows an exemplary embodiment of a timing window adjuster of FIG. 5.

FIG. 7 shows an exemplary embodiment of a receiver that includes a clock tracking, or clock recovery, function. As shown in FIG. 7, the receiver 180 recovers a clock to be used to strobe data. The construction of the clock recovery circuit of FIG. 7 is basically the same as that of the clock recovery circuit of FIG. 2. That is, the clock recovery components of the receiver 180 of FIG. 2, which is in a non-testing mode, are basically the same as those in the receiver 180 of FIG. 7 in a testing mode. It should be appreciated that the clock recovery components of FIG. 7 that are identical or equivalent to those of FIG. 2 are designated by the same reference numerals, and a detailed description of such elements are thus omitted.

In accordance with various exemplary embodiments of this invention, in a testing mode, additional circuitry may be added to adjust the phase of the recovered clock so that it will intentionally move, or change, phases during the testing mode In these exemplary embodiments, to adjust the phase of the regenerated clock, the phase adjuster 182 is provided to adjust the detected phase in a phase detector of a phase locked loop. As shown in FIG. 7, in the receiver 180, a phase locked loop 1800 consists of a voltage controlled oscillator (VCO) 1802, a divider 1804, a phase detector 1806, and a loop filter 1808. Incoming data stream I and I# with an embedded clock are provided to the phase locked loop 1800, and the recovered clock from the phase locked loop 1800 is input to the sense amplifier 181 which outputs recovered data to the buffer 183 and then decoder 185. As shown in FIG. 7, the phase adjuster 182 is connected to the phase detector 1806 to adjust the phase detector 1806.

By adjusting the phase of the phase detector 1806 and moving the phase of the recovered clock from the phase locked loop 1800, the width of the data eye of the transmitted data stream I and I# received from the transmitter 140 may be determined. In the exemplary embodiment of FIG. 7, an adjustment of the phase detector 1806 shifts the relative phase difference between the recovered clock and the incoming data stream. Thus, instead of the phase adjuster 182 controlling the frequency of the clock to match the received signal to center the clock in the data eye, as in the normal mode as shown in FIG. 2, in the testing mode, the phase adjuster 182 adjusts the phase detector 1806 by adding phase delay, through adding capacitance to the phase detector, or the like, to keep the clock and the signal out of phase. Thus, in the on-chip system 100 of FIG. 5, the size of the data eye can be determined by the extent of the possible shift the relative phase of the recovered clock shifts with the data eye.

It should be appreciated that many other possibilities for clock data recovery exist, and that the receiver 180 above is not limited to the above exemplary embodiment.

In a receiver testing mode, contrary to the transmitter testing mode above, the receiver 180 is the device to be tested and the transmitter 140 is the tester. In testing the receiver 180, the voltage level is shifted and noise is introduced at the transmitter 140 as programmed and maintained by the transmitter test register 120. The amount of noise and power loss tolerated by the receiver 180 is determined using the programmed values maintained by the transmitter test register 120. In particular, the programmed values are maintained as the voltage level is shifted and noise is introduced until the values are unrealizable, at which point, the tolerance by the system is indicated.

In the receiver testing mode according to the various exemplary embodiments of this invention, a real life situation is mimicked, where degraded signals due to long cables, poor connection, phase mismatch, noise jitters, extreme pattern sequences and the like, exist. In particular, noise is injected into the data stream and varying differential levels are introduced. Several elements including varying the bias, varying the generated patterns and jittering the signals, may be used to stress the signal. To identify which element is causing the receiver 180 not to receive data reliably, stress may be applied to the element individually.

To recover data, the receiver 180 is synchronized, and the clock is recovered from this noisy incoming signal stream. In these exemplary embodiments, the loopback design is similar to that for testing the transmitter 140, with the exception of the receiver 180 being in the normal non-testing mode, and the transmitter 140 being in the testing mode.

Figure 8:
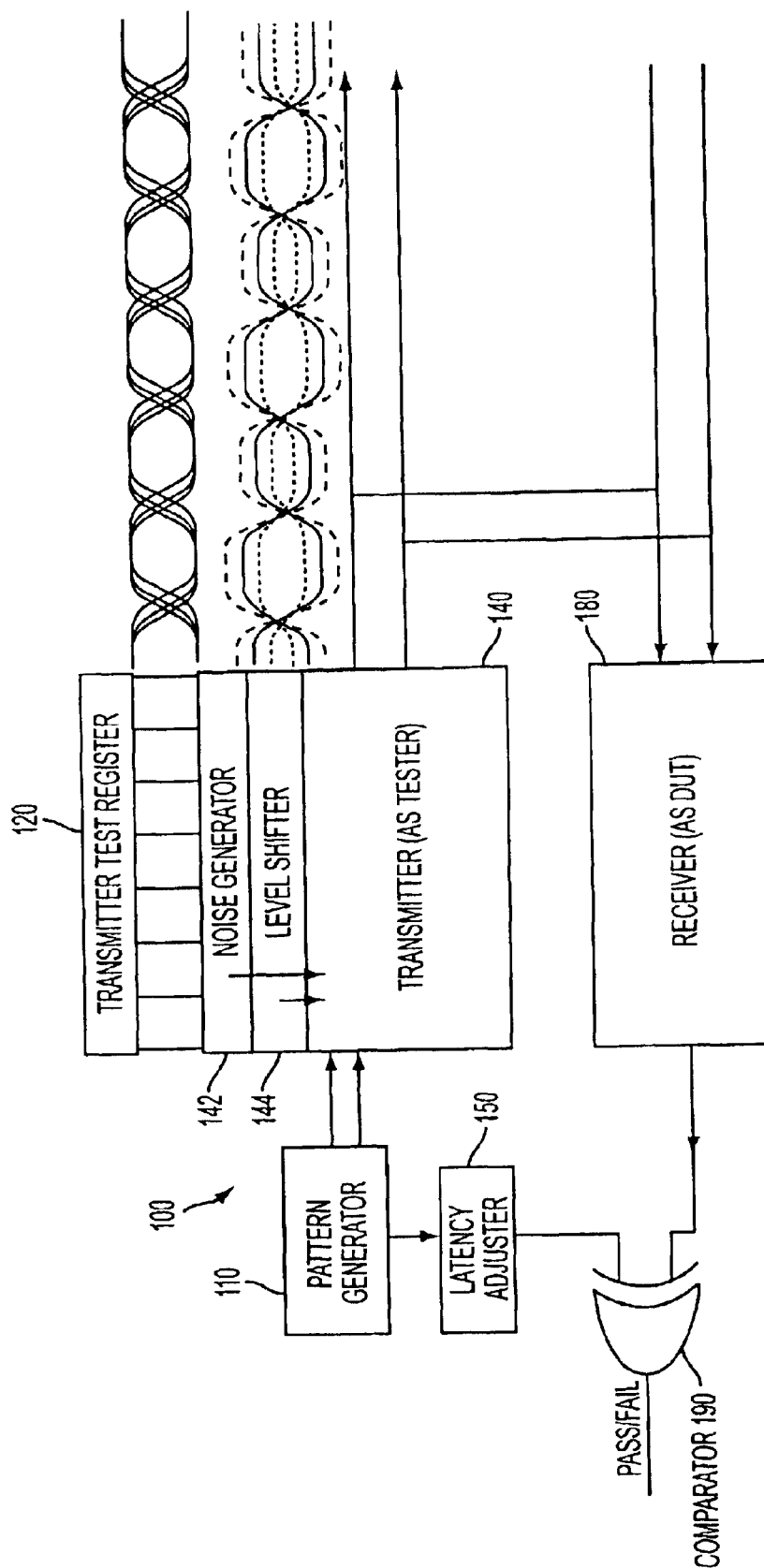
FIG. 8 shows an exemplary embodiment of the on-chip system of FIG. 4 in a receiver testing mode.

FIG. 8 shows an exemplary embodiment of the on-chip system 100 of FIG. 4 in a receiver testing mode. As shown in FIG. 8, the receiver 180 is the device under test (DUT), and the transmitter 140 is the tester. As discussed above, the transmitter 140 and the receiver 180 are connected. In these embodiments, a transmitter test register 120 is provided, and the receiver 180 is tested by programming the transmitter test register 120 to introduce noise and jitter into the signal transmitted by the transmitter 140 to the receiver 180 to determine the ability of the receiver 180 to synchronize jittering and degraded signals. That is, as shown in FIG. 8, a noise generator 142 and a level shifter 144 are provided in these exemplary embodiments, and the transmitter test register 120 is programmed such that the noise generator 142 introduces noise by varying the phase of the transmitted signal in the time domain, while the level shifter 144 shifts the voltage level of the transmitted signal to adjust the transmitted data in the voltage level domain.

The construction of the on-chip system 100 of FIG. 8 is basically the same as that of the on-chip system 100 of FIG. 2. Thus, it should be appreciated that the components of FIG. 2 that are identical or equivalent to those of FIG. 8 are designated by the same reference numerals, and a detailed description of such elements are thus omitted.

As shown in FIG. 8, the transmitter 140 will generate noisy and level shifted signal intentionally to the receiver 180. The noise is injected into the time domain by the noise generator 142, and the voltage level is shifted in the voltage level domain by the level shifter 144, either simultaneously or independently for diagnosis purpose. Thus, the ability of the receiver 180 to track the noisy and level shifted signals can be tested.

It should be appreciated that the noise and level shift provided by the noise generator 142 and level shifter 144 is correlated to the worst-case noise as seen in a system to guarantee the optimal performance of the receiver 180. Similarly, it should be appreciated that any margin in the loopback circuitry that is designed for compensating the losses and noise introduced in the on-chip system 100 in a normal transmission mode is removed to correlate the worst-case noise in the testing mode.

Figure 9:
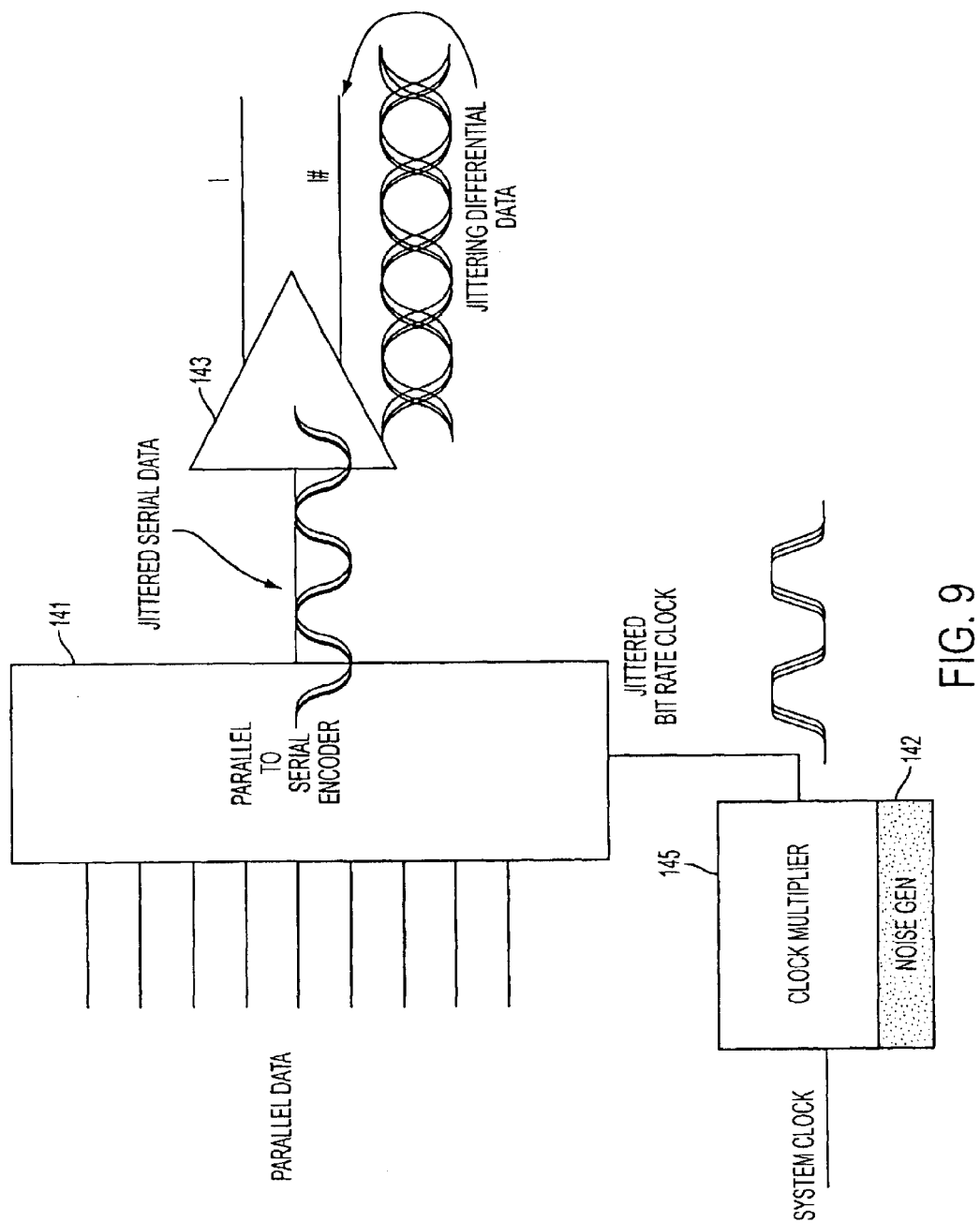
FIG. 9 shows an exemplary embodiment of the noise generator of FIG. 8.

FIG. 9 shows an exemplary embodiment of a transmitter including a noise generator of FIG. 8. The construction of the transmitter of FIG. 9 is basically the same as that of the clock generation circuit of FIG. 2. That is, the clock generation components of the transmitter 140 of FIG. 2, which is in a non-testing mode, are basically the same as those in the transmitter 140 of FIG. 9 in a testing mode. It should be appreciated that the components of FIG. 9 that are identical or equivalent to those of FIG. 2 are designated by the same reference numerals, and a detailed description of such elements are thus omitted.

As shown in FIG. 9, the noise generator 142 is connected to the clock multiplier 145 to generate jitter in the system clock. The clock multiplier 145 is connected to the parallel to serial encoder 141, which in turn is connected to the differential driver 143. To inject noise into the data stream provided to the transmitter 140, as shown in FIG. 9, one exemplary embodiment includes introducing noise generated by the noise generator 142 into the high speed system clock provided by the clock multiplier 145 to the transmitter 140.

The noise generator 142 introduces jitter into the transmitter 140 by jittering the system clock to introduce a jittered bit rate clock into the data stream input to the transmitter 140. Thus, noise is injected in the time domain of the transmitted data. As shown in FIG. 9, a jittered bit rate clock is provided to affect the data stream. As shown in FIG. 9, the system clock is input to the clock multiplier 145, where noise is introduced by the noise generator 142. The jittered bit rate clock is then input to the parallel to serial encoder 141 to obtain the jittered serial data. The jittered serial data from the parallel to serial encoder 141 is then input to the differential driver 143, where the jittered differential data is output as the outgoing data stream I and I#.

In the exemplary embodiment described above, as the system clock is generated on chip, the noise generator 142 may be added to the to perturb the control voltage. The perturbed control voltage causes the frequency to vary, introducing jittering noise into the data stream.

Figure 10:
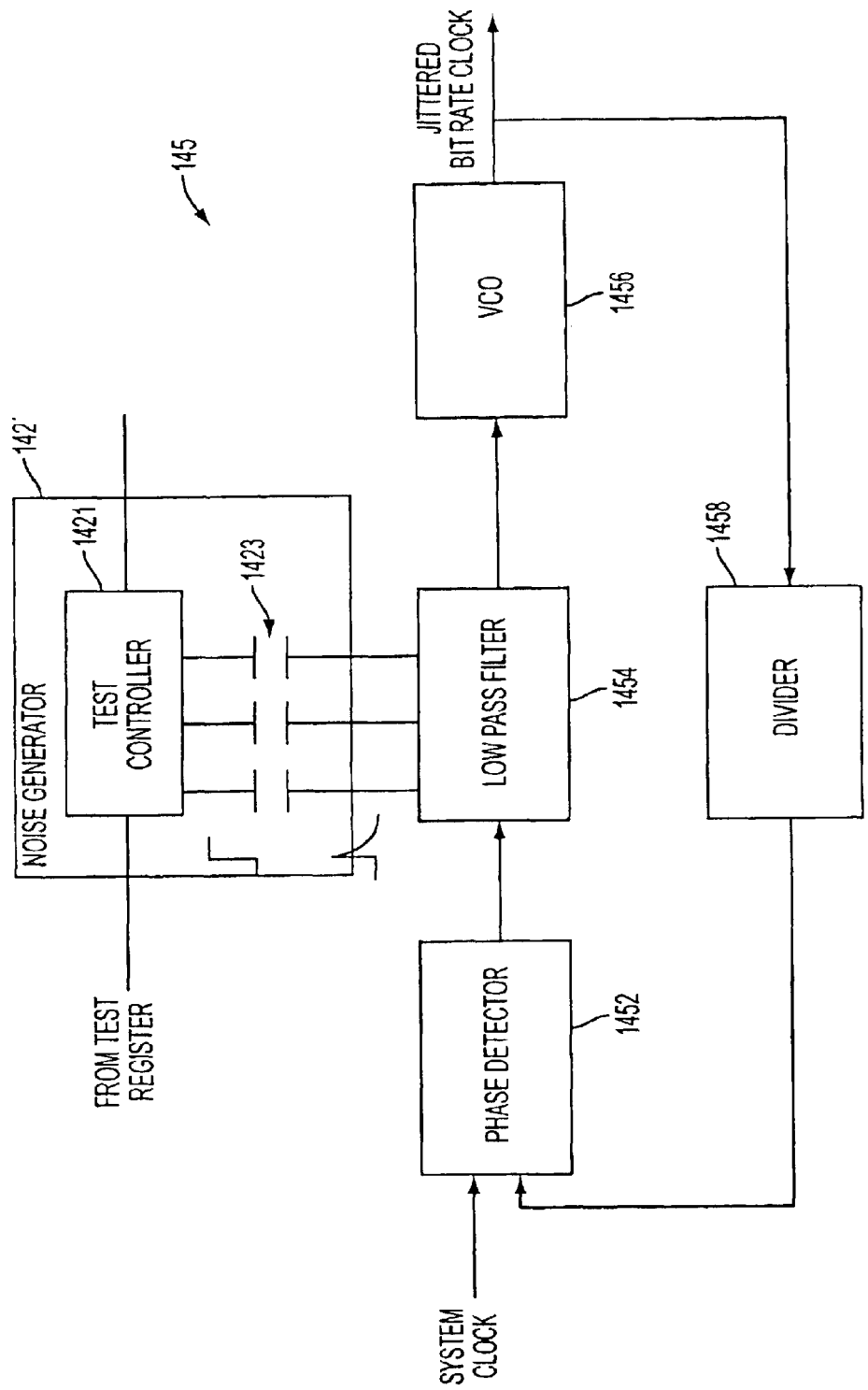
FIG. 10 shows another exemplary embodiment of the noise generator of FIG. 9.

FIG. 10 shows an exemplary embodiment of a clock multiplier and noise generator of FIG. 8. As shown in FIG. 10, the clock multiplier 145 is provided in a phase locked loop (PLL), and the noise generator 142' is provided to introduce noise into the phase locked loop (PLL) 145. The phase locked loop (PLL) 145 includes a phase detector 1452, a low pass filter 1454, a voltage controlled oscillator (VCO) 1456, and a divider 1458. In this exemplary embodiment, the noise generator 142' comprises a test controller 1421 connected to the transmitter test register 120, which functions as a pseudo random generator to generate random patterns, and a plurality of capacitors 1423. As shown in FIG. 10, the noise generator 142' is connected to the low pass filter 1454 to insert noise into the low pass filter 1454.

As shown in FIG. 10, a capacitive coupling technique using the capacitors 1423 is used to inject charge from the noise generator 142' into the low pass filter 1454. Because the control voltage for the voltage controlled oscillator (VCO) 1456 connected to the low pass filter 1454 is usually filtered with a simple RC circuit, the spikes coupled onto the control voltage for the voltage controlled oscillator (VCO) 1456 is modulated to result in jitter of output of the voltage controlled oscillator (VCO) 1456. As shown in FIG. 10, the system clock input to the phase locked loop (PLL) 145, where a desired amount of jitter is introduced, and a jittered bit rate clock is output from the phase locked loop (PLL) 145 to the parallel to serial encoder 141. Thus, randomness is introduced into the transmitter 140, whereby different levels of coupling with various transition edges are introduced.

Figure 11:
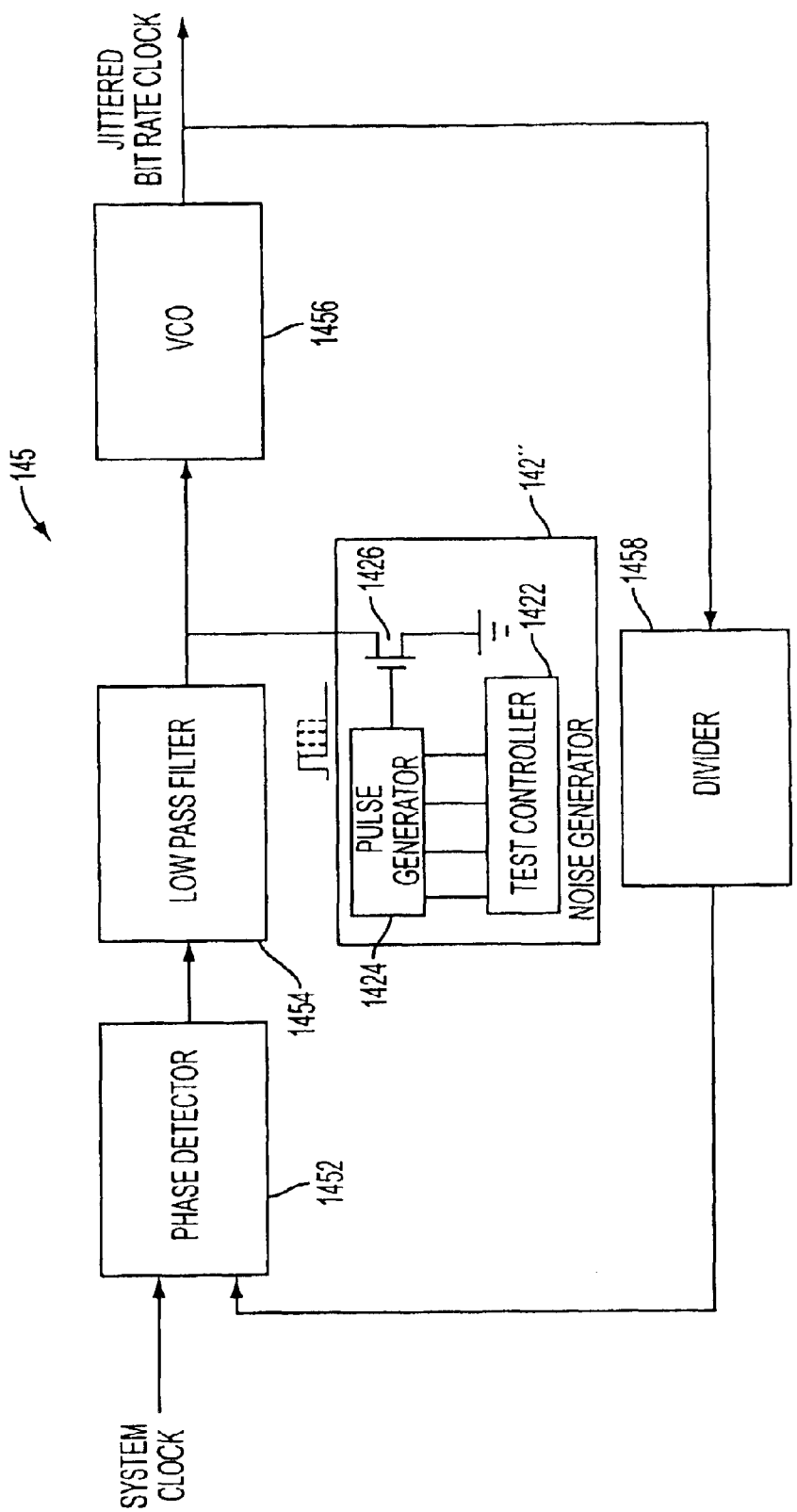
FIG. 11 shows another exemplary embodiment of the noise generator of FIG. 8.

FIG. 11 shows another exemplary embodiment of a phase locked loop including the noise generator of FIG. 9. Similar to the exemplary embodiment in FIG. 10, in FIG. 11, the noise generator 142" is connected to the phase locked loop (PLL) 145 to inject jitter to the control voltage of the voltage control oscillator (VCO) 1456 in the phase locked loop (PLL) 145. As shown in FIG. 11, the noise generator 142" comprises a test controller 1422, a pulse generator 1424 and a small transistor 1426. In the exemplary embodiment in FIG. 11, the noise generator 142" is provided between the low pass filter 1454 and the voltage controlled oscillator (VCO) 1456. In this exemplary embodiment, the noise generator 142" is provided to short the control voltage to the voltage controlled oscillator (VCO) 1456 to ground for a controlled duration. By shorting control voltage to ground for a controlled duration, the desired amount of jitter is provided to the bit rate clock output to the parallel to serial encoder 141. As shown in FIG. 11, the small transistor 1426 is added in parallel to the control signal. As the transistor 1426 is turned on in the testing mode, the duration that the transistor 1426 turns on produces a drop in the control voltage to the voltage controlled oscillator (VCO) 1456. Accordingly, jitter on the output of the voltage controlled oscillator (VCO) 1456, or the bit rate clock, is produced, introducing the desired amount of jitter to the transmitter 140.

Figure 12:
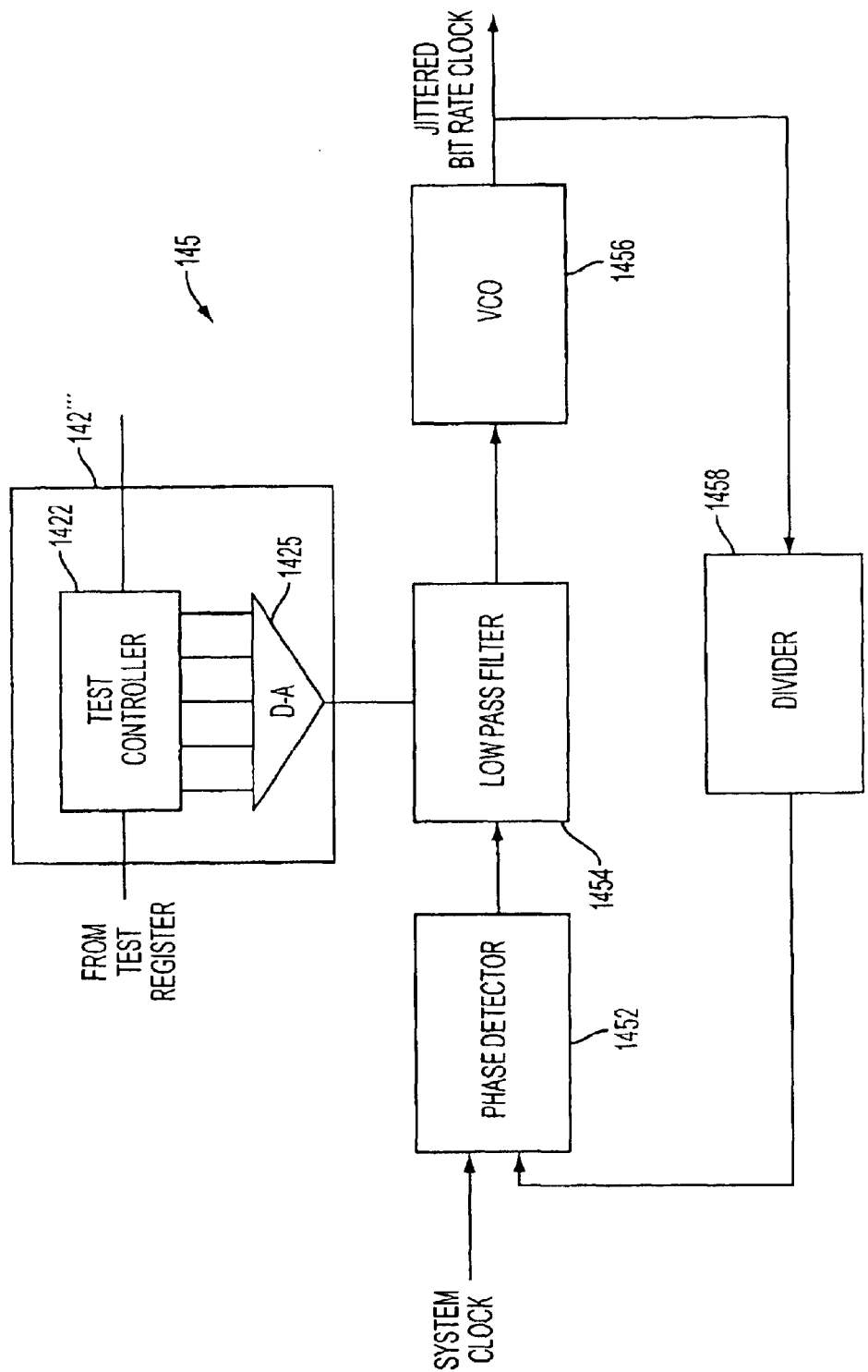
FIG. 12 shows another exemplary embodiment of the noise generator of FIG. 8.

FIG. 12 shows yet another exemplary embodiment of a phase locked loop (PLL) 145 connected to the noise generator of FIG. 9. Similar to the exemplary embodiments in FIGS. 10 and 11, in FIG. 12, the noise generator 142''' is connected to a phase locked loop (PLL) 145 to introduce noise into the phase locked loop (PLL) 145. In this embodiment, the noise generator 142 comprises a test controller 1422 connected to the transmitter test register 120 which functions as a pseudo random generator to generate random patterns, and a D-A converter 1425 to translate the random patterns to provide the desired amount of control voltage variation, and consequently jitter. As shown in FIG. 12, the D-A converter 1425 is connected to the low pass filter 1454 to modulate the control voltage to the voltage controlled oscillator (VCO) 1456. Accordingly, jitter on the output of the voltage controlled oscillator (VCO) 1456, or the bit rate clock, is produced, introducing the desired amount of jitter to the transmitter 140.

Figure 13:
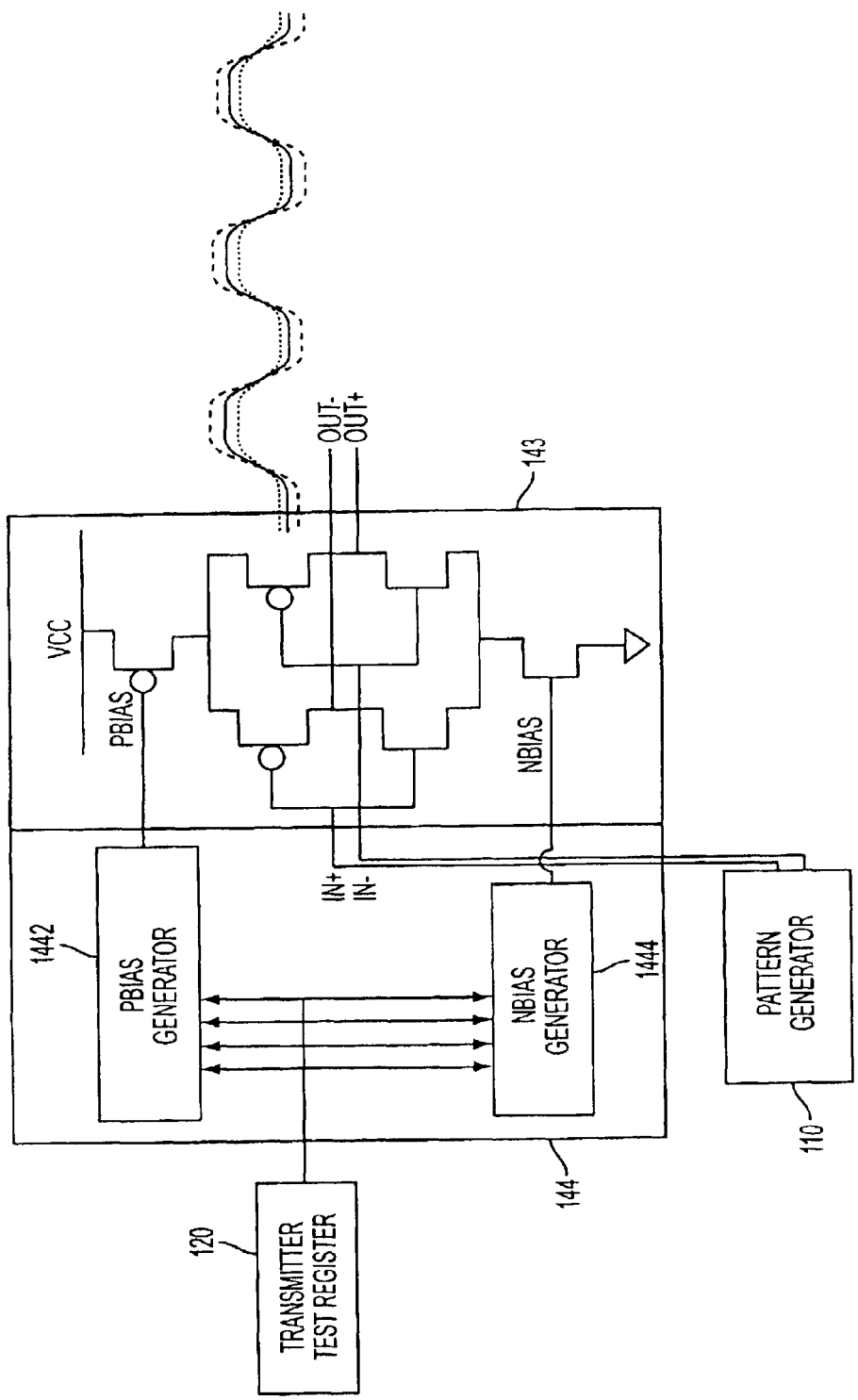
FIG. 13 shows another exemplary embodiment of the level shifter of FIG. 8.

FIG. 13 shows an exemplary embodiment of a transmitter provided with a level shifter of FIG. 8. As shown in FIG. 13, the transmitter 140 is connected to the pattern generator 110 and the level shifter 144. In this exemplary embodiment, the level shifter 144 varies the voltage level of the generated voltage bias Pbias and Nbias. As shown in FIG. 13, the level shifter 144 includes a Pbias generator 1442 and an Nbias generator 1444 to produce varying levels. The Pbias generator 1442 and the Nbias generator 1444 apply specific variations to the pseudo-random pattern or deterministic pattern applied by the pattern generator 110, to mimic true noise effects in a system. That is, the transmitter test register 120 programs the Pbias generator 1442 and the Nbias generator 1444 to select different biases, resulting in random drive level variations to the random pattern. Thus, contrary to the normal mode where the bias provided by the Pbias generator 1442 and the Nbias generator 1444 is kept constant, in the test mode, the level shifter 144 varies Pbias and Nbias to modulate the current. Accordingly, variance in the voltage level is produced, introducing the desired amount of voltage level shift to the transmitter 140.

It should be appreciated that the different biases are designed in and fabricated into the circuit on chip. In the test mode, the test register 120 then selects the desired amount of variation to stress test the receiver 180. Alternately, a separate bias voltage can also be supplied from test equipment to replace the on-chip bias voltages, but this will require separate pins and test resource synchronization.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An integrated circuit, comprising:
   a serial transmitter having a data input and a data output disposed on a chip;
   a serial receiver having a data input and a data output provided on the chip;
   a switch to couple the transmitter data output to the receiver data input; and
   a characteristics varying circuit on the chip coupled to the receiver to selectively vary the characteristics of the receiver in order to determine the size of a data eye of a signal transmitted by the transmitter.

2. The integrated circuit of claim 1, further comprising a pattern generator that generates predetermined sequences of patterns and providesing a signal pattern to the transmitter to be transmitted as the signal transmitted.

3. The integrated circuit of claim 2, the pattern generator being a pseudo-random pattern generator.

4. The integrated circuit of claim 2, further comprising a latency adjuster that coupled in series between the pattern generator and the transmitter and providesing a delay to the signal pattern.

5. The integrated circuit of claim 4, and further comprising a pass/fail comparator that compares for a match between the delayed signal from the latency adjuster and a signal output from the receiver to determine the data eye.

6. The integrated circuit of claim 1, wherein said signal transmitted by said transmitter is a clocked digital signal, and said characteristics varying circuit comprises a phase adjuster that adjusts an edge of a recovered clock of the transmitted signal to determine a data eye width.

7. The integrated circuit of claim 6, the receiver comprising a phase locked loop that comprises a phase detector, the phase adjuster adjusting the phase detector to determine a shift in relative phase of the recovered clock of the transmitted signal.

8. The integrated circuit of claim 1, wherein said characteristics varying circuit comprises a threshold shifter that adjusts an offset of the signal transmitted by the transmitter to determine voltage swing size.

9. The integrated circuit of claim 8, the threshold shifter comprising a plurality of transistors that vary the capacitance and cause a change in offset.

10. The integrated circuit of claim 6, and wherein said characteristics varying circuit further includes a threshold shifter that adjusts an offset of the signal transmitted by the transmitter to determine voltage swing size.

11. The integrated circuit of claim 6, the characteristics varying circuit further includes a level shifter that shifts the voltage level of a signal to be received by the receiver.

12. The integrated circuit of claim 11, wherein the level shifter comprises a Pbias generator and an Nbias generator.

13. The integrated circuit of claim 11 and wherein said characteristics varying circuit further includes a threshold shifter that adjusts an offset of the signal transmitted by the transmitter to determine voltage swing size.

14. The integrated circuit of claim 1, and further including a further characteristics varying circuit on the chip coupled to the transmitter to vary the characteristics of a transmitted signal to be received by the receiver to test the receiver.

15. The integrated circuit of claim 14, the further characteristic varying circuit comprising a noise generator that injects noise by adjusting a phase of a clock of the signal to be received by the receiver.

16. The integrated circuit of claim 15, the noise generator comprising a clock multiplier, the noise generator jittering a bit rate clock from the clock multiplier.

17. The integrated circuit of claim 15, the noise generator comprising a test controller that generates random patterns and a plurality of capacitors, the noise generator being connected to a low pass filter and injecting jitter to the low pass filter.

18. The integrated circuit of claim 15, the noise generator comprising a test controller, a pulse generator and a transistor, the noise generator shorting a control voltage with controlled duration.

19. The integrated circuit of claim 15, the noise generator comprising a test controller that generates random patterns and a D-A converter that restricts the random patterns, the noise generator providing control voltage variation.

* * * * *

UNITED STATES PATENT AND TRADEMARK OFFICE
CERTIFICATE OF CORRECTION

PATENT NO. : 6,885,209 B2
DATED : April 26, 2005
INVENTOR(S) : Tak M. Mak et al.

It is certified that error appears in the above-identified patent and that said Letters Patent is hereby corrected as shown below:

Column 12,
Line 26, "providing a signal pattern" should be -- provides a signal pattern --.
Line 31, "adjuster that coupled" should be -- adjuster that is coupled --.
Line 32, "providesing a delay" should be -- provides a delay --.

Signed and Sealed this

Twenty-fifth Day of October, 2005

JON W. DUDAS
*Director of the United States Patent and Trademark Office*